US012221534B2

(12) United States Patent
Uchida et al.

(10) Patent No.: US 12,221,534 B2
(45) Date of Patent: Feb. 11, 2025

(54) COMPOSITION

(71) Applicant: DENKA COMPANY LIMITED, Tokyo (JP)

(72) Inventors: Tometomo Uchida, Tokyo (JP); Takashi Domoto, Tokyo (JP); Takako Tanigawa, Tokyo (JP); Kenji Nomura, Tokyo (JP); Yoshitsugu Goto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 675 days.

(21) Appl. No.: 17/293,879

(22) PCT Filed: Nov. 14, 2019

(86) PCT No.: PCT/JP2019/044773
§ 371 (c)(1),
(2) Date: May 13, 2021

(87) PCT Pub. No.: WO2020/101000
PCT Pub. Date: May 22, 2020

(65) Prior Publication Data
US 2022/0010116 A1 Jan. 13, 2022

(30) Foreign Application Priority Data
Nov. 14, 2018 (JP) ................. 2018-213530

(51) Int. Cl.
| | |
|---|---|
| C08L 23/22 | (2006.01) |
| C08K 5/3417 | (2006.01) |
| C08K 5/5397 | (2006.01) |
| C08L 33/02 | (2006.01) |
| C09J 7/10 | (2018.01) |
| C09J 133/02 | (2006.01) |

(52) U.S. Cl.
CPC ............ *C08L 23/22* (2013.01); *C08K 5/3417* (2013.01); *C08K 5/5397* (2013.01); *C08L 33/02* (2013.01); *C09J 7/10* (2018.01); *C09J 133/02* (2013.01); *C09J 2423/00* (2013.01)

(58) Field of Classification Search
CPC ........ C08L 23/22; C08L 33/02; C08L 5/3417; C08L 5/5397; C09J 7/10; C09J 7/133; C08F 2/50; C08F 255/10; H01L 21/6836; H01L 2221/68318; H01L 2221/68327; H01L 2221/68381; H01L 2221/68386; H01L 21/304
See application file for complete search history.

(56) References Cited

U.S. PATENT DOCUMENTS

| | | | |
|---|---|---|---|
| 8,232,350 B2 | 7/2012 | Fujita et al. | |
| 9,067,398 B2 | 6/2015 | Kurimura et al. | |
| 2009/0026934 A1 | 1/2009 | Fujita et al. | 313/504 |
| 2009/0104448 A1* | 4/2009 | Thompson | B32B 37/12 156/273.5 |
| 2009/0314417 A1* | 12/2009 | Sasaki | H01L 21/6836 156/154 |
| 2010/0038035 A1 | 2/2010 | Noda et al. | 156/379.6 |
| 2010/0041211 A1 | 2/2010 | Noda et al. | |
| 2011/0105637 A1* | 5/2011 | Fujita | C09J 123/22 257/E23.116 |
| 2011/0230621 A1 | 9/2011 | Hildebrandt et al. | 525/216 |
| 2012/0301639 A1* | 11/2012 | Grigorenko | C09D 5/29 428/323 |
| 2013/0092326 A1 | 4/2013 | Goto et al. | 156/712 |
| 2014/0103499 A1 | 4/2014 | Andry et al. | |
| 2017/0077440 A1 | 3/2017 | Yoo et al. | |
| 2017/0101560 A1 | 4/2017 | Mitsui et al. | |

FOREIGN PATENT DOCUMENTS

| | | |
|---|---|---|
| CN | 1703773 A | 11/2005 |
| CN | 104718605 A | 6/2015 |
| JP | 2004-64040 A | 2/2004 |
| JP | 2004-210879 A | 7/2004 |
| JP | 2005-023205 A | 1/2005 |
| JP | 2006-328104 A | 12/2006 |
| JP | 2009-524705 A | 7/2009 |
| JP | 2010-270316 A | 12/2010 |
| JP | 2014-101495 A | 6/2014 |
| JP | 5890177 B2 | 3/2016 |
| JP | 6139862 B2 | 5/2017 |
| JP | 2017-226785 A | 12/2017 |
| JP | 2018-48274 A | 3/2018 |
| WO | WO 2009/096459 A1 | 8/2009 |
| WO | WO 2011/158654 A1 | 12/2011 |

(Continued)

OTHER PUBLICATIONS

Scientific Polymer Products (Poly(lauryl acrylate) data sheet; no date).*
Aronix Data Sheet (Toagosei Co., Ltd.; no date).*
Machine English translation of Nishiura et al.; JP 2004-210879 (Year: 2004).*
Tabata, machine English translation of WO 2018/174085 (Year: 2018).*
U.S. Appl. No. 17/923,377, filed Nov. 4, 2022 in the name of Tometomo Uchida.
Nov. 17, 2022 International Preliminary Report on Patentability issued in International Patent Application No. PCT/JP2021/018671.

(Continued)

*Primary Examiner* — Jessica M Roswell
(74) *Attorney, Agent, or Firm* — Oliff PLC

(57) ABSTRACT

A composition for temporary bonding, including the following (A) to (C). An adhesive for temporary bonding for manufacturing an electronic device, including the composition for temporary bonding. (A) A (meth)acrylate comprising the following (A-1) and (A-2): (A-1) a monofunctional (meth)acrylate whose homopolymer has a Tg of −100° C. to 60° C., and (A-2) a polyfunctional (meth)acrylate; (B) a polyisobutene homopolymer; and (C) a photo radical polymerization initiator.

18 Claims, 1 Drawing Sheet

(56) References Cited

FOREIGN PATENT DOCUMENTS

| WO | WO 2016/039277 A1 | 3/2016 |
| WO | WO 2018/174085 A1 | 9/2018 |
| WO | 2020/080309 A1 | 4/2020 |
| WO | WO 2020/101000 A1 | 5/2020 |

OTHER PUBLICATIONS

Feb. 10, 2020 International Search Report issued in International Patent Application No. PCT/JP2019/044773.
Extended European Search Report mailed on Nov. 29, 2021, issued to corresponding EP Application No. 19885090.1.
International Search Report dated Jul. 13, 2021, issued to International Application No. PCT/JP2021/018671.
Jun. 22, 2023 Office Action issued in Chinese Patent Application No. 202180032669.7.
International Preliminary Report on Patentability issued May 18, 2021, to the corresponding International Application No. PCT/JP2019/044773.
Jan. 31, 2024 Office Action issued in Chinese Patent Application No. 202180032669.7.
Dec. 4, 2024 Office Action issued in U.S. Appl. No. 17/923,377.

* cited by examiner

XPS
Apparatus: X-ray photoelectron spectroscopy K-Alpha made by Thermo Fisher Scientific K. K.
Excitation source: Al-X radioactive source with monochromator
Measurement region: 400 × 200 μm Common Acquisition Parameters Table
Parameter
Dwell time          50msec
Number of Scans     3
Source Type         Al K Alpha
Spot Size           400 μm
Lens Mode           Standard
Analyser Mode       CAE : Pass Energy 200.0 eV
Energy Step Size    1.000 eV
No. of Energy Steps 1362

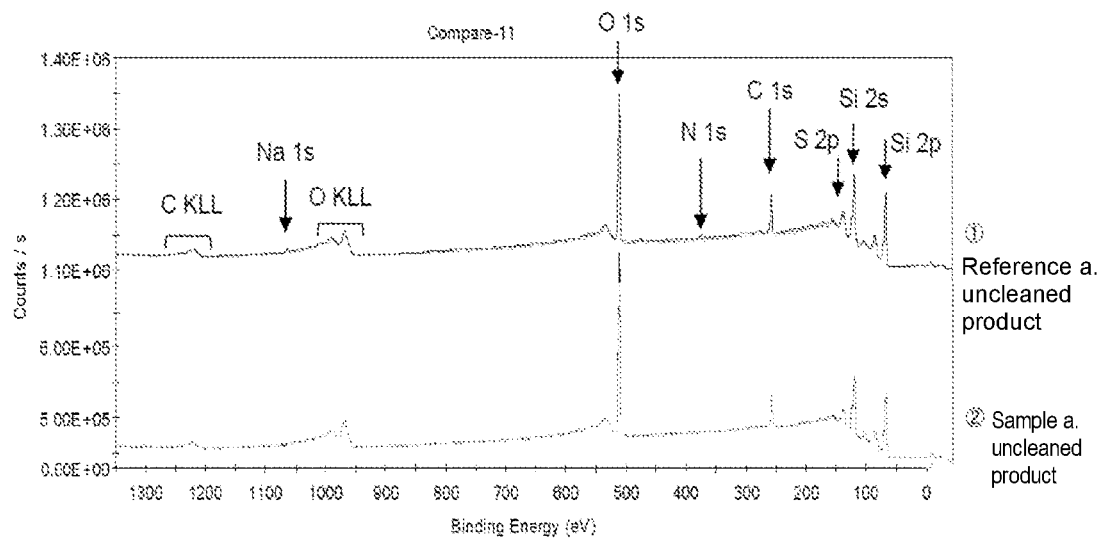

Overlapping qualitative analysis spectra of samples

COMPOSITION

CROSS-REFERENCE TO RELATED APPLICATIONS

This application is a national stage of International Application No. PCT/JP2019/044773, filed Nov. 14, 2019, which claims the benefit of Japanese Application No. 2018-213530, filed Nov. 14, 2018, in the Japanese Patent Office, the disclosures of which are incorporated herein by reference.

TECHNICAL FIELD

The present invention relates to a composition for temporary bonding used for temporary bonding.

BACKGROUND ART

Electronic devices are mainly composed of a substrate made of an inorganic material such as silicon, and are produced by forming an insulating film and a circuit on the surface and applying processing such as thinning by grinding. In processing, when a wafer substrate is used, a substrate having a thickness of about a few hundred microns is frequently used. Since most of the materials of the substrate is fragile and easily broken, measures to prevent breaking need to be taken particularly for thinning by grinding. A method has been taken as such measures, in which a protective tape for temporary bonding, which can be released after the completion of the step of processing, is applied to the side opposite to the side to be ground (also referred to as a rear side or back side). An organic resin film is used for the substrate of the tape, and although the tape is flexible, their strength and heat resistance are insufficient, and thus the tape is not suitable for use in steps at high temperature.

Then, systems have been proposed, which provides durability sufficient for conditions in the process for backgrinding and for forming an electrode on the back side by bonding the substrate of an electronic device to a support such as silicon or glass by an adhesive. What is important in the system is the adhesive layer for bonding the substrate and the support. The adhesive layer needs to be capable of bonding the substrate and the support without any gap, and have durability sufficient for withstanding the subsequent steps, and needs to enable the thinned wafer to be easily released from the support in the final step.

Properties required for adhesives include: (1) viscosity suitable for application; (2) shear adhesive force withstanding grinding and polishing when thinning a substrate; (3) adequate hardness to avoid breaking of a substrate due to local conversion of the load of the grindstone applied to the substrate in grinding and polishing when thinning the substrate while dispersing the load in the in-plane direction to prevent local sagging of the substrate to maintain flatness; (4) heat resistance withstanding formation of insulating film and the step of soldering reflow; (5) chemical resistance withstanding thinning and resist steps; (6) easy release which enables the substrate to be easily released from the support; (7) properties of aggregation which leave no residue of the adhesive on the substrate after release; and (8) easiness of washing.

As an adhesive and a method for release thereof, proposed are a technique in which an adhesive containing a light-absorbing substance is irradiated with light at high intensity to decompose the adhesive layer so that the adhesive layer is released from the support (Patent Literature 1); and a technique in which a heat-melting hydrocarbon compound is used as an adhesive to perform bonding and release in the molten state by heating (Patent Literature 2). The problem with the former technique is that it requires an expensive apparatus such as a laser and the time for processing per substrate is long. The latter technique is convenient because the process is controlled only by heating, but since heat stability of the adhesive is insufficient at a temperature as high as more than 200° C., it can only be applied to a limited range.

A method for disassembling a bonded body is proposed, including a step for irradiating, with excimer light with a central wavelength of 172 nm or 193 nm, the bonded body formed by laminating substrates using an adhesive composition containing one or two or more (meth)acrylates having one or more (meth)acryloyl groups and curing the adhesive composition, in which at least one of the substrates transmits the excimer light (Patent Literature 3). However, Patent Literature 3 does not disclose use of light with longer wavelength. The present invention eliminates the need to use excimer light having high energy in a method for release.

A technique of an adhesive composition for encapsulating an electronic device, which contains, as a resin composition, a polyisobutene resin and a polyfunctional (meth)acrylate and does not contain a tackifier, is disclosed (Patent Literature 4). The literature also discloses use of monofunctional (meth)acrylate as a monomer, but since the glass transition temperature of the monofunctional (meth)acrylate is not disclosed, the problem is that how to exhibit flexibility, which is required when using the resin composition as an agent for temporary bonding in the process for manufacturing an electronic device, is not clear.

A technique of an adhesive composition for encapsulating an electronic device such as an organic electroluminescent device, which contains, as a resin composition, a monofunctional (meth)acrylate, a polyfunctional (meth)acrylate and a polyisobutene homopolymer, is also disclosed (Patent Literature 5). However, since the glass transition temperature of the monofunctional (meth)acrylate is not disclosed, the problem is that how to exhibit flexibility, which is required when using the resin composition as an agent for temporary bonding in the process for manufacturing an electronic device, is not clear.

A resin composition for bonding substrates of a different material, which contains a monofunctional (meth)acrylate, a polyfunctional (meth)acrylate and an isobutene/maleic anhydride copolymer, and a method for bonding and disassembling the same are disclosed (Patent Literature 6). However, the polymer of Patent Literature 6 is not a homopolymer of isobutene which does not include a component derived from maleic anhydride, and the literature does not disclose details of the method of adhesion. Patent Literature 6 does not describe their suitability for spin coating, such as viscosity.

A technique of a composite resin composition curable by active energy beams, which comprises a urethane acrylate resin having an olefin polymer structure and polyisobutylene resin is disclosed (Patent Literature 7). However, Patent Literature 7 does not disclose temporary bonding.

CITATION LIST

Patent Literature

Patent Literature 1: Japanese Patent Laid-Open No. 2004-064040

Patent Literature 2: Japanese Patent Laid-Open No. 2006-328104
Patent Literature 3: International Publication No. WO 2011/158654
Patent Literature 4: Japanese Patent No. 5890177
Patent Literature 5: Japanese Translation of PCT International Application Publication No. 2009-524705
Patent Literature 6: Japanese Patent No. 6139862
Patent Literature 7: Japanese Patent Laid-Open No. 2017-226785

SUMMARY OF INVENTION

Technical Problem

Thus, an unsolved problem is that the conventional compositions are not very compatible, not suitable for spin coating processes or not heat resistant when used for temporary bonding, or they are not very suitable for mechanical release or laser release processes.

Solution to Problem

That is, the present invention is as follows:
<1> A composition for temporary bonding, comprising the following (A) to (C):
(A) a (meth)acrylate comprising the following (A-1) and (A-2):
(A-1) a monofunctional (meth)acrylate whose homopolymer has a Tg of −100° C. to 60° C., and
(A-2) a polyfunctional (meth)acrylate;
(B) a polyisobutene homopolymer; and
(C) a photo radical polymerization initiator.
<2> The composition for temporary bonding according to <1>, wherein the component (A-1) is a monofunctional (meth)acrylate having an alkyl group.
<3> The composition for temporary bonding according to <1> or <2>, wherein the polyfunctional (meth)acrylate (A-2) has a molecular weight of 900 or less.
<4> The composition for temporary bonding according to any one of <1> to <3>, wherein the component (A-2) is a polyfunctional (meth)acrylate having an alicyclic skeleton.
<5> The composition for temporary bonding according to any one of <1> to <4>, wherein the component (A-2) is one or more selected from tricyclodecanedimethanol di(meth)acrylate and 1,3-di(meth)acryloyloxyadamantane.
<6> The composition for temporary bonding according to any one of <1> to <5>, wherein the component (B) is a polyisobutene homopolymer having a weight average molecular weight of 1,000 or more and 5,000,000 or less and a molecular weight distribution of 1.1 or more and 5.0 or less.
<7> The composition for temporary bonding according to any one of <1> to <6>, wherein the component (C) is one or more photo radical polymerization initiators selected from an acylphosphine oxide compound and an oxime ester compound.
<8> The composition for temporary bonding according to any one of <1> to <7>, wherein the component (C) is one or more selected from bis(2,4,6-trimethylbenzoyl)phenylphosphine oxide and 1-[9-ethyl-6-(2-methylbenzoyl)-9H-carbazol-3-yl]etanone 1-(O-acetyloxime).
<9> The composition for temporary bonding according to any one of <1> to <8>, comprising 0.01 to 5 parts by mass of the component (C) based on 100 parts by mass of the total amount of the components (A) and (B).
<10> The composition for temporary bonding according to any one of <1> to <9>, comprising 54 to 90 parts by mass of the component (A-1), 1 to 40 parts by mass of the component (A-2) and 1 to 20 parts by mass of the component (B) based on 100 parts by mass of the total amount of the components (A) and (B).
<11> An adhesive for temporary bonding, comprising the composition for temporary bonding according to any one of <1> to <10>.
<12> A cured body obtained by curing the composition for temporary bonding according to any one of <1> to <10>.
<13> An adhesive sheet comprising the cured body according to <12>.
<14> The cured body according to <12>, wherein the temperature at which the mass reduction ratio by heating reaches 1% by mass is 250° C. or more.
<15> An adhesive for temporary bonding for manufacturing an electronic device, comprising the composition for temporary bonding according to any one of <1> to <10>.
<16> A bonded body obtained by adhering a substrate using the adhesive for temporary bonding for manufacturing an electronic device according to <15>.
<17> A method for producing a thin wafer, comprising using the adhesive for temporary bonding for manufacturing an electronic device according to <15>.
<18> The adhesive for temporary bonding for manufacturing an electronic device according to <15>, which is for mechanical release.
<19> The adhesive for temporary bonding for manufacturing an electronic device according to <15>, which is for UV laser release.

Advantageous Effects of Invention

The present invention may provide a composition having, for example, excellent compatibility, suitability for spin coating processes and heat resistance. The present invention may also provide a composition for temporary bonding, which is suitable for mechanical release or various laser release processes.

BRIEF DESCRIPTION OF DRAWING

FIG. 1 is XPS analysis data of the surface of a bare silicon wafer after bonding a bare Si wafer to a glass support using a sample having the composition of Example 1 of the present invention and releasing the wafer therefrom.

DESCRIPTION OF EMBODIMENTS

The present invention will be described below. In the present description, the numerical range includes the upper limit and the lower limit unless otherwise specified.

The monofunctional (meth)acrylate refers to a compound having one (meth)acryloyl group per a molecule. The polyfunctional (meth)acrylate means a compound having two or more (meth)acryloyl groups per a molecule. The n-functional (meth)acrylate means a compound having n or more number of (meth)acryloyl groups per a molecule.

Embodiments of the present invention may provide a composition for temporary bonding used for temporary bonding (hereinafter may be referred to as a composition), comprising the following (A) to (C).

(A) A (meth)acrylate comprising the following (A-1) and (A-2):
(A-1) a monofunctional (meth)acrylate whose homopolymer has a Tg of −100° C. to 60° C., and
(A-2) a polyfunctional (meth)acrylate;
(B) a polyisobutene homopolymer; and
(C) a photo radical polymerization initiator.

The monofunctional (meth)acrylate whose homopolymer has a Tg of −100° C. to 60° C. (A-1) refers to a monofunctional (meth)acrylate whose homopolymer prepared by single polymerization has a glass transition temperature (hereinafter may be abbreviated as "Tg") of −100° C. to 60° C. A monofunctional(meth)acrylate whose homopolymer has a Tg of −50° C. to 0° C. is more preferred.

Examples of (meth)acrylates whose homopolymer has a Tg of −100° C. to 60° C. include lauryl (meth)acrylate (Tg of homopolymer of acrylate: −30° C., Tg of homopolymer of methacrylate: −65° C.), 2-ethylhexyl (meth)acrylate (Tg of homopolymer of acrylate: −85° C., Tg of homopolymer of methacrylate: −10° C.), n-butyl (meth)acrylate (Tg of homopolymer of methacrylate: 20° C.), i-butyl (meth)acrylate (Tg of homopolymer of methacrylate: 20° C.), t-butyl (meth)acrylate (Tg of homopolymer of methacrylate: 20° C.), methoxyethyl (meth)acrylate (Tg of homopolymer of acrylate: −50° C.), ethylene glycol di(meth)acrylate, 1,3-butylene glycol di(meth)acrylate, dicyclopentenyloxyethyl (meth)acrylate (Tg of homopolymer: 25° C.), 2-hydroxyethyl (meth)acrylate (Tg of homopolymer of methacrylate: 55° C.), 2-hydroxypropyl (meth)acrylate (Tg of homopolymer of acrylate: −7° C., Tg of homopolymer of methacrylate: 26° C.), 2-hydroxybutyl (meth)acrylate, 4-hydroxybutyl (meth)acrylate, n-octyl (meth)acrylate (Tg of homopolymer of acrylate: −65° C.), isooctyl (meth)acrylate (Tg of homopolymer of acrylate: −58° C., Tg of homopolymer of methacrylate: −30° C.), isostearyl (meth)acrylate (Tg of homopolymer of acrylate: −18° C., Tg of homopolymer of methacrylate: 30° C.), isononyl (meth)acrylate (Tg of homopolymer of acrylate: −58° C., Tg of homopolymer of methacrylate: −30° C.), 2-decyl-1-tetradecanyl (meth)acrylate (Tg of homopolymer of acrylate: −36° C., Tg of homopolymer of methacrylate: 10° C.), 2-tetradecyl-1-octadecanyl (meth)acrylate (Tg of homopolymer of acrylate: −8° C.), nonylphenoxypolyethylene glycol (having a —(CH$_2$CH$_2$O)$_n$— structure, n=1 to 17) Tg of (meth)acrylate homopolymer: −25 to 20° C.) and phenoxyethylene glycol acrylate (Tg of homopolymer: −25 to 30° C.). One or two of these (meth)acrylates may be used.

The glass transition means a change of a substance, in which the viscosity of the substance which is liquid at high temperature, such as glass, is rapidly increased in a certain temperature range due to decrease in temperature and the substance becomes little flowable and becomes amorphous solid. The method for measuring glass transition temperature is not particularly limited, and the glass transition temperature is usually those calculated by, for example, thermogravimetry, differential scanning calorimetry, differential thermal analysis or dynamic viscoelasticity measurement. Of them, dynamic viscoelasticity measurement is preferred.

The glass transition temperature of the homopolymer of (meth)acrylate is described in, for example, J. Brandrup, E. H. Immergut, Polymer Handbook, 2nd Ed., J. Wiley, New York 1975 and Data Book of Photocuring Technology (TECHNO-NET BOOKS).

The component (A-1) may preferably be a monofunctional (meth)acrylate having a molecular weight of 550 or less.

The component (A-1) may preferably be a monofunctional alkyl (meth)acrylate having an alkyl group.

The alkyl group may preferably be one or more selected from a linear alkyl group, a branched alkyl group and a cyclic alkyl group. One or more selected from a linear alkyl group and a branched alkyl group are preferred. The component (A-1) preferably have a long chain branched alkyl group or a cycloalkyl group, for example, a branched alkyl group or a cycloalkyl group such as an isostearyl group, an isotetracosanyl group (e.g., a 2-decyl-1-tetradecanyl group) and iso-dotriacontanyl group (e.g., 2-tetradecyl-1-octadecanyl group) having 12 or more carbon atoms, preferably 12 to 40 carbon atoms, further preferably 12 to 32 carbon atoms, from the viewpoint of improvement of compatibility with the component (B) (in particular, improvement of compatibility with the component (B) having high molecular weight). Using such a long chain, high molecular weight and highly aliphatic component (more preferably increasing aliphaticity of the whole system) improves involatility, chemical resistance and heat resistance required for the composition for temporary bonding.

The monofunctional alkyl (meth)acrylate having an alkyl group (A-1) is preferably a (meth)acrylate of the following formula 1.

[Formula 1]

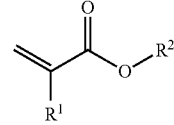

(formula 1)

R$^1$ is a hydrogen atom or a methyl group. R$^2$ is an alkyl group.
R$^1$ may preferably be a hydrogen atom.
R$^2$ may preferably have 4 to 32 carbon atoms, more preferably 8 to 28 carbon atoms, further preferably 12 to 24 carbon atoms, most preferably 16 to 20 carbon atoms, and particularly preferably 18 carbon atoms. One or more of these (meth)acrylates may be used.

Preferred examples of monofunctional alkyl (meth)acrylate in which R$^2$ has an alkyl group having 4 to 32 carbon atoms may include (meth)acrylate having a linear or branched alkyl group, such as butyl (meth)acrylate, amyl (meth)acrylate, isoamyl (meth)acrylate, hexyl (meth)acrylate, n-octyl (meth)acrylate, isooctyl (meth)acrylate, 2-ethylhexyl (meth)acrylate, nonyl (meth)acrylate, isononyl (meth)acrylate, decyl (meth)acrylate, isodecyl (meth)acrylate, dodecyl (meth)acrylate, lauryl (meth)acrylate, tridecyl (meth)acrylate, tetradecyl (meth)acrylate, pentadecyl (meth)acrylate, hexadecyl (meth)acrylate, heptadecyl (meth)acrylate, stearyl (meth)acrylate, isostearyl (meth)acrylate, nonadecyl (meth)acrylate, eicodecyl (meth)acrylate, behenyl (meth)acrylate, 2-decyl-1-tetradeca (meth)acrylate and 2-tetradecyl-1-octadecanyl (meth)acrylate. Among them, isostearyl (meth)acrylate is preferred.

Of the component (A-1), monofunctional (meth)acrylate having a branched alkyl group having 10 or more carbon atoms in the side chain is also preferred. Examples of monofunctional (meth)acrylate having a branched alkyl group having 10 or more carbon atoms in the side chain include one or more selected from 2-decyl-1-tetradecanyl (meth)acrylate and 2-tetradecyl-1-octadecanyl (meth)acrylate.

The amount of the monofunctional (meth)acrylate (A-1) used may preferably be 54 to 90 parts by mass, more preferably 54 to 80 parts by mass, and further preferably 54 to 75 parts by mass based on 100 parts by mass of the total amount of the components (A) and (B). When the amount is 54 parts by mass or more, the resin composition after mixing is unlikely to be phase-separated and flexibility at room temperature is obtained. When the amount is 90 parts by mass or less, viscosity required for application, heat resistance and curability are obtained. The amount of monofunctional (meth)acrylate used in the conventional composition disclosed in Patent Literature 7 is less than 53 parts by mass, and thus flexibility required for the composition for temporary bonding for manufacturing an electronic device is unlikely to be obtained.

The polyfunctional (meth)acrylate (A-2) refers to a compound having two or more (meth)acryloyl groups in a molecule. The polyfunctional (meth)acrylate may have an acryloyl group alone or a methacryloyl group alone, or both of the acryloyl group and the methacryloyl group as the meth(acryloyl) group.

The polyfunctional (meth)acrylate (A-2) may have a molecular weight of preferably 900 or less, more preferably 700 or less, most preferably 500 or less, and particularly preferably 300 or less.

Examples of polyfunctional (meth)acrylates (A-2) include bifunctional (meth)acrylate, trifunctional (meth)acrylate and tetra- or more functional (meth)acrylate.

Examples of bifunctional (meth)acrylates include 1,3-adamantane dimethanol di(meth)acrylate, tricyclodecane dimethanol di(meth)acrylate, 1,3-butanediol di(meth)acrylate, 1,4-butanediol di(meth)acrylate, 1,6-hexadiol di(meth)acrylate, 1,9-nonanediol di(meth)acrylate, 1,10-decanediol di(meth)acrylate, neopentyl glycol di(meth)acrylate, dicyclopentanyl di(meth)acrylate, neopentyl glycol-modified trimethylolpropane di(meth)acrylate, stearic acid-modified pentaerythritol di(meth)acrylate, tripropylene glycol di(meth)acrylate, 2,2-bis(4-(meth)acryloxydiethoxyphenyl)propane, 2,2-bis(4-(meth)acryloxypropoxyphenyl)propane, 2,2-bis(4-(meth)acryloxytetraethoxyphenyl)propane and isocyanuric acid ethylene oxide-modified di(meth)acrylate.

Examples of trifunctional (meth)acrylates include isocyanuric acid ethylene oxide-modified tri(meth)acrylate, pentaerythritol tri(meth)acrylate, trimethylolpropane tri(meth)acrylate and tris[(meth)acryloxyethyl] isocyanurate.

Examples of tetra- or more functional (meth)acrylates include ditrimethylolpropane tetra(meth)acrylate, dimethylolpropane tetra(meth)acrylate, pentaerythritol tetra(meth)acrylate, pentaerythritolethoxy tetra(meth)acrylate, dipentaerythritol penta(meth)acrylate and dipentaerythritol hexa(meth)acrylate.

Of the component (A-2), polyfunctional (meth)acrylate having an alicyclic structure is preferred, and polyfunctional (meth)acrylate having an alicyclic structure having 5 or more carbon atoms is more preferred. The polyfunctional (meth)acrylate having an alicyclic structure having 5 or more carbon atoms is preferably one or more selected from tricyclodecanedimethanol di(meth)acrylate and 1,3-di(meth)acryloyloxyadamantane.

The amount of the polyfunctional (meth)acrylate (A-2) used may preferably be 1 to 40 parts by mass, more preferably 10 to 30 parts by mass, and further preferably 20 to 26 parts by mass based on 100 parts by mass of the total amount of the components (A) and (B). When the amount is 1 part by mass or more, good curability, heat resistance and release properties are obtained. When the amount is 40 parts by mass or less, the composition after mixing is unlikely to be phase-separated or heat resistance may not be reduced.

The polyisobutene homopolymer (B) refers to a homopolymer obtained by polymerization using isobutene as a raw material monomer.

It is preferable that the polyisobutene homopolymer (B) be of what is called high molecular weight grade from the viewpoint of provision of appropriate viscosity when mixed with the component (A). The polyisobutene homopolymer (B) may have a weight average molecular weight of preferably 1,000 or more and 5,000,000 or less, and more preferably 80,000 or more and 5,000,000 or less. Furthermore, the polyisobutene homopolymer (B) may have a molecular weight distribution of preferably 1.1 or more and 5.0 or less, and more preferably 2.2 or more and 2.9 or less. In particular, the weight average molecular weight may be preferably 80,000 or more and 5,000,000 or less and the molecular weight distribution is 2.2 or more and 2.9 or less. One or more of these polyisobutene homopolymers may be used.

The weight average molecular weight is measured by gel permeation chromatography (GPC) in terms of standard polystyrene. More specifically, the average molecular weight was determined by preparing a calibration curve using tetrahydrofuran as a solvent and using a GPC system (SC-8010 manufactured by Tosoh Corporation) with a commercially available standard polystyrene under the following conditions.

Flow rate: 1.0 ml/min
Set temperature: 40° C.
Configuration of columns: a total of 3 columns of 1 column of "TSK guard column MP (xL)" 6.0 mmID× 4.0 cm made by Tosoh Corporation and 2 columns of "TSK-GEL MULTI PORE HXL-M" 7.8 mm ID×30.0 cm (theoretical plate number: 16,000 plates; the total theoretical plate number: 32,000 plates)
Amount of sample injected: 100 µl (concentration of sample solution 1 mg/ml)
Pressure of feeding liquid: 39 kg/cm$^2$
Detector: RI detector The amount of the polyisobutene homopolymer (B) used may preferably be 1 to 20 parts by mass, and more preferably 5 to 20 parts by mass based on 100 parts by mass of the total amount of the components (A) and (B). When the amount is 1 part by mass or more, viscosity necessary for application can be provided. When the amount is 20 parts by mass or less, the composition after mixing is unlikely to be phase-separated and good curability and heat resistance can be obtained. Use of the component (B) of what is called high molecular weight grade described above provides not only an effect that easily achieves the desired viscosity even if the amount added is small, but also an effect that achieves suitability for spin coating and suitability for bar coating; in other words, the target process can be selected for the suitability.

The photo radical polymerization initiator (C) is, for example, a compound whose molecules are disconnected and divided into two or more radicals by irradiation of ultraviolet light or visible light.

The photo radical polymerization initiator (C) may preferably be one or more selected from an α-aminoalkylphenone compound, an acylphosphine oxide compound and an oxime ester compound, from the viewpoints of reaction speed, heat resistance after curing and low outgas properties. One or more selected from an acylphosphine oxide compound and an oxime ester compound are more preferred because they are highly sensitive.

Examples of α-aminoalkylphenone compounds include 2-benzyl-2-dimethylamino-1-(4-morpholinophenyl)butanone-1 and 2-dimethylamino-2-(4-methyl-benzyl)-1-(4-morpholin-4-yl-phenyl)-butan-1-one. Among them, 2-dimethylamino-2-(4-methyl-benzyl)-1-(4-morpholin-4-yl-phenyl)-butan-1-one is preferred.

Examples of acylphosphine oxide compounds include bis(2,4,6-trimethylbenzoyl)phenylphosphine oxide and 2,4,6-trimethylbenzoyldiphenylphosphine oxide. Among them, bis(2,4,6-trimethylbenzoyl)phenylphosphine oxide is preferred.

Examples of oxime ester compounds include 1-[9-ethyl-6-(2-methylbenzoyl)-9H-carbazol-3-yl]etanone 1-(O-acetyloxime). Among them, 1-[9-ethyl-6-(2-methylbenzoyl)-9H-carbazol-3-yl]etanone 1-(O-acetyloxime) is preferred.

The amount of the photo radical polymerization initiator (C) used may preferably be 0.01 to 5 parts by mass, more preferably 0.1 to 1 part by mass based on 100 parts by mass of the total amount of (A) and (B) from the viewpoints of reaction speed, heat resistance after curing and low outgas properties. When the amount is 0.01 part by mass or more, sufficient curability are obtained. When the amount is 5 parts by mass or less, the heat resistance and low outgas properties are unlikely to be impaired.

An antioxidant may be used for the composition of the present invention in order to maintain releasability after being exposed to high temperature. Examples of antioxidants include methyl hydroquinone, hydroquinone, 2,2-methylene-bis(4-methyl-6-t-butylphenol), catechol, hydroquinone monomethyl ether, mono-t-butyl hydroquinone, 2,5-di-t-butyl hydroquinone, p-benzoquinone, 2,5-diphenyl-p-benzoquinone, 2,5-di-t-butyl-p-benzoquinone, picric acid, citric acid, phenothiazine, t-butyl catechol, 2-butyl-4-hydroxyanisole, 2,6-di-t-butyl-p-cresol and 4-[[4,6-bis(octylthio)-1,3,5-triazin-2-yl]amino]-2,6-di-t-butylphenol.

The amount of the antioxidant used is preferably 0.001 to 3 parts by mass based on 100 parts by mass of the total amount of (A) to (C). When the amount is 0.001 part by mass or more, releasability after being exposed to high temperature is surely maintained. When the amount is 3 parts by mass or less, good adhesion is obtained and uncuring does not occur.

Known methods of application such as coaters, screen printing and spin coating may be used as the method for applying the composition. The composition of the present invention has a viscosity of preferably 100 mPa·s or more, more preferably 1,000 mPa·s or more, and most preferably 2,000 mPa·s or more from the viewpoints of coating properties and operationability. The composition of the present invention has a viscosity of preferably 10,000 mPa·s or less, more preferably 5,000 mPa·s or less, and most preferably 4,000 mPa·s or less from the viewpoints of coating properties and operationability. When the viscosity is 100 mPa·s or more, coating properties, in particular coating properties in spin coating are excellent. When the amount is 10,000 mPa·s or less, operationability is excellent.

Spin coating process refers to a method in which, for example, a liquid composition is dropped on a substrate and the substrate is rotated at a predetermined rotational speed to coat the surface of the substrate with the composition. Spin coating enables high quality coating to be produced efficiently.

The composition of the present invention may be used as a resin composition for temporary bonding. The composition of the present invention may be used as an adhesive for temporary bonding. The composition of the present invention may be cured and used as an adhesive sheet. The composition of the present invention may be used as an adhesive for temporary bonding for manufacturing an electronic device.

It is preferable that when substrates are bonded using the composition of the present invention, the composition be irradiated with visible light or ultraviolet light (wavelength 365 to 405 nm) so that the amount of energy is 1 to 20,000 mJ/cm$^2$. An amount of energy of 1 mJ/cm$^2$ or more provides sufficient adhesiveness, and an amount of energy of 20,000 mJ/cm$^2$ or less provides excellent productivity, generates few decomposition products from photo radical polymerization initiator, and suppresses generation of outgas. The amount of energy is preferably 1 to 10,000 mJ/cm$^2$ from the viewpoints of productivity, adhesiveness, low outgas properties and easy release.

Although the substrate to be bonded using the composition of the present invention is not particularly limited, it is preferable that at least one substrate be a transparent substrate which transmits light. Examples of transparent substrates include inorganic substrates such as crystal, glass, quartz, calcium fluoride and magnesium fluoride, and organic substrates such as plastic. Of them, inorganic substrates are preferred because they are versatile and provide high effects. Of the inorganic substrates, one or more selected from glass and quartz are preferred.

In an embodiment, the composition of the present invention is photo-curable, and the cured body has excellent heat resistance and releasability. In an embodiment the amount of outgas from the cured body of the composition of the present invention is small even when exposed to high temperature, and thus the cured body is suitable for bonding, encapsulating and coating various optical parts, optical devices and electronic parts. The composition of the present invention is suitable for applications in which wide-ranging durability such as solvent resistance, heat resistance and adhesiveness, is required, and in particular, suitable for processes for manufacturing semiconductors.

The cured body of the composition of the present invention can be used at room temperature to high temperature. The temperature of heating in a process may preferably be 350° C. or less, more preferably 300° C. or less, and most preferably 250° C. or less. The bonded body bonded using (the cured body of) the adhesive for temporary bonding of the present invention has high shear adhesive strength and can withstand the step for thinning and the like, and can be easily released after the step for heating, such as forming an insulating film. When used at high temperature, the cured body of the composition of the present invention may be used at a high temperature of, for example, preferably 200° C. or more, and more preferably 250° C. or more.

Furthermore, in an embodiment of the present invention, substrates may be released by applying an external force to a bonded body obtained by bonding the substrate using an adhesive. For example, it may be released by inserting a blade, sheet or wire.

Method for Producing Thin Wafer

The method for producing a thin wafer of the present invention comprises using an adhesive for temporary bonding (hereinafter may be referred to as an adhesive) as an adhesive layer between wafer with a semiconductor circuit and the like and a support. The method for producing a thin wafer of the present invention comprises the following steps (a) to (e).

[Step (a)]

The step (a) is a step in which, when bonding a circuit-bearing surface of a wafer having the circuit-bearing surface on the front and a circuit-free surface on the back to a support with an adhesive, the adhesive is applied to the support or the wafer with the circuit by spin coating to bond another support or wafer with circuit in vacuum.

The wafer having a circuit-bearing surface and a circuit-free surface has the circuit-bearing surface on one side and the circuit-free surface on the other side. Generally the present invention can be applied to semiconductor wafers. Examples of semiconductor wafers include not only silicon wafer but also gallium nitride wafer, lithium tantalate wafer, lithium niobate wafer, silicon carbide wafer, germanium wafer, gallium-arsenide wafer, gallium-phosphorus wafer and gallium-arsenide-aluminum wafer. The thickness of the wafer is not particularly limited, and is preferably 600 to 800 µm, and more preferably 625 to 775 µm. A transparent substrate which transmits light may be used as a support.

[Step (b)]

The step (b) is for photo-curing the adhesive. It is preferable that after forming the processed wafer (laminated substrate), the wafer be irradiated with light in a region of visible light or ultraviolet light (wavelength 365 nm to 405 nm) with the amount of energy of 1 to 20,000 mJ/cm$^2$. An amount of energy of 1 mJ/cm$^2$ or more provides sufficient adhesiveness, and an amount of energy of 20,000 mJ/cm$^2$ or less provides excellent productivity, generates few decomposition products from photo radical polymerization initiator, and suppresses generation of outgas. The amount of energy is more preferably 1,000 to 10,000 from the viewpoints of productivity, adhesiveness, low outgas properties and easy release.

[Step (c)]

The step (c) is for grinding or polishing the circuit-free surface of the wafer bonded to the support, in other words, the step for grinding the back side of the processed wafer obtained by lamination in the step (a) to reduce the thickness of the wafer. The thinned wafer has a thickness of preferably 10 to 300 µm, and more preferably 30 to 100 µm. The method of grinding the back side of the wafer is not particularly limited and a known grinding method may be used. It is preferable that the wafer be ground while pouring water to the wafer and the grindstone (such as diamond) to cool them.

[Step (d)]

The step (d) is for processing the processed wafer whose circuit-free surface has been ground; in other words, processing the circuit-free surface of the processed wafer which has been thinned by grinding the back side. The step includes various processes used at the wafer level, such as formation of electrodes, formation of metal wiring and formation of protective film. More specifically, it includes conventionally known processes such as metal sputtering for forming an electrode and the like, wet etching for etching the metal-sputtering layer, formation of patterns by application of resist for preparing mask for forming metal wiring, exposure and development, removal of resist, dry etching, formation of metal plating, silicon etching for forming TSV and formation of oxide film on the surface of silicon.

[Step (e)]

The step (e) is a release step. In the step, the wafer processed in the step (d) is released from the processed wafer. For example, the step is for releasing wafer from the processed wafer before dicing after doing various processing on the thinned wafer. At that stage, dicing tape may be attached in prior to the release to the side which has been thinned and processed. The release step is usually carried out in a condition of a relatively low temperature of room temperature to about 60° C. For the release step, any of a known mechanical release step, UV or IR laser release step may be employed. The mechanical release step includes, for example, horizontally fixing the processed wafer with the wafer facing downward so as to insert a blade into the end of the interface of the processed wafer to make an opening between the wafer and the support and after inserting the blade, applying upward stress to the support on the upper side to extend the opening to release the wafer from the support. Such a release step is disclosed in, for example, Japanese Patent No. 6377956 and Japanese Patent Laid-Open No. 2016-106404. The IR laser release step is a step for, for example, irradiating the entire surface of a processed wafer with IR laser so that the wafer is scanned with the laser linearly and reciprocally from the end of an optically transparent support in the direction of a tangent to heat and decompose the adhesive layer with the energy of the laser to release the wafer. Such a release step is disclosed in, for example, Japanese Patent 4565804. To perform the IR laser release step, a light heat converting layer (e.g., "LTHC" manufactured by 3M) which absorbs IR laser light and converts it to energy may be provided between a layer of temporary bonding agent and a glass support. When LTHC made by 3M is used, LTHC is, for example, spin-coated and cured on the glass support, and the layer of temporary bonding agent, which is spin-coated on wafer, is laminated on the glass support on which the LTHC layer has been formed, and they may be UV cured. The method for carrying out the IR laser release step using LTHC made by 3M is disclosed, for example, in Japanese Patent No. 4565804 described above. The UV laser release step is a step in which a processed wafer is irradiated from the side of the optically transparent support in the same manner as in the IR laser release step to decompose the adhesive layer to release the wafer. Such a release step is disclosed in, for example, Japanese Translation of PCT International Application Publication No. 2019-501790, and International Publication No. WO 2014/058601.

Any of the above release methods may be used for releasing the composition according to the embodiment of the present invention. It is preferable that in these cases, one end of the wafer of the processed wafer or the support be horizontally fixed and then a blade be inserted thereinto, or the periphery of the adhesive layer be swollen using a solvent (e.g., aliphatic or an aromatic hydrocarbon solvents such as pentane, hexane, heptane, octane, nonane, decane, benzene, toluene, xylene and mesitylene) to cause release, and the other end be lifted at a certain angle in the horizontal direction. Although these methods are usually performed at room temperature, heating at an upper limit of about 90° C. is also preferred. When laser is used, YAG laser or YVO$_4$ laser is preferably used.

When the step (e) for releasing the processed wafer from a support is a mechanical release step, it is preferable that the step further includes the steps of:
(f) adhering dicing tape on the wafer surface of a processed wafer,
(g) vacuum sucking the side of the dicing tape to the suction surface, and
(h) releasing the support from the processed wafer at a temperature of the suction surface ranging from 10 to 100° C. This facilitates release of the support from the processed wafer and makes it easier to perform the subsequent dicing step.

Laser-releasing process may preferably further include the steps of:
(i) setting and fixing a processed wafer at a horizontal position with an optically transparent support facing upward preferably via dicing tape, and (j) scanning of the entire surface of the processed wafer with laser from the side of the support.

This facilitates release of the support from the processed wafer and makes it easier to perform the subsequent dicing step.

The wafer after the step (e) for releasing the processed wafer from the support may be sent to the subsequent step without washing the surface. It is preferable that when the surface is to be washed, a step (k) for removing adhesive remaining on the circuit-bearing surface of the released wafer be performed after the step for releasing the processed wafer from the support. A part of the adhesive may remain on the circuit-bearing surface of the wafer released from the support in the step (e). While it is preferable that the support released be washed and reused, residue of adhesive may be adhered on the surface of the support. Examples of methods for removing residue of adhesive include a method in which adhesive tape is attached to the residue of adhesive and peeled off at the angle of 180° and a method of immersion in a chemical solution.

Apart from the composition for temporary bonding described above, all or part of the materials constituting the composition for temporary bonding of the present invention may also be used as a raw material of a light heat converting layer (also abbreviated to as "LTHC") which absorbs IR laser light and converts it to energy disclosed in Japanese Patent No. 4565804. Using the present composition as a raw material for the LTHC layer may improve heat resistance of the photothermal conversion layer.

EXAMPLES

Hereinafter the present invention will be described in more detail with reference to Examples, but the present invention is not limited thereto.

Experimental Examples

Experiments were carried out at 23° C. and a humidity of 50% unless otherwise specified. The curable resin compositions (hereinafter may be referred to as a liquid resin composition) having the composition shown in Tables 1 to 5 were prepared and evaluated. The following compounds were selected as the components of the curable resin compositions described in Experimental Examples.

Composition

The following compounds were selected as the monofunctional (meth)acrylate (A-1) whose homopolymer has a Tg of −100° C. to 60° C.

Isostearyl acrylate ("ISTA" made by Osaka Organic Chemical Industry Ltd., glass transition temperature of homopolymer: −18° C., molecular weight 325)

2-decyl-1-tetradecanyl acrylate ("LIGHT ACRYLATE DTD-A" made by Kyoeisha Chemical Co., Ltd., glass transition temperature of homopolymer: −36° C.; also abbreviated to as "DTD-A", molecular weight 409)

2-tetradecyl-1-octadecanyl acrylate (LIGHT ACRYLATE DOD-A" made by Kyoeisha Chemical Co., Ltd., glass transition temperature of homopolymer: −8° C.; also abbreviated to as "DOD-A", molecular weight 521)

The following compounds were selected as the polyfunctional (meth)acrylate (A-2).

Tricyclodecane dimethanol diacrylate ("NK ester A-DCP" made by Shin-Nakamura Chemical Co., Ltd.; also abbreviated to as "A-DCP", molecular weight 304)

Tricyclodecane dimethanol dimethacrylate ("NK ester DCP" made by Shin-Nakamura Chemical Co., Ltd.; also abbreviated to as "DCP", molecular weight 332)

1,3-diacryloyloxy adamantane ("DIAPUREST ADDA" made by Mitsubishi Gas Chemical Company Inc.; also abbreviated to as "ADDA", molecular weight 276)

Trimethylolpropane trimethacrylate ("NK ester TM PT" made by Shin-Nakamura Chemical Co., Ltd.; also abbreviated as "TMPT", molecular weight 338)

The following compounds were selected as a polyisobutene homopolymer (B).

Oppanol N 150EP made by BASF, polystyrene-equivalent weight average molecular weight (Mw): 3,050,000, molecular weight distribution 2.9.

Oppanol N 100 made by BASF, polystyrene-equivalent weight average molecular weight (Mw): 1,550,000, molecular weight distribution 2.9.

Oppanol N 80 made by BASF, polystyrene-equivalent weight average molecular weight (Mw): 1,050,000, molecular weight distribution 2.4.

Oppanol N 50SF made by BASF, polystyrene-equivalent weight average molecular weight (Mw): 565,000, molecular weight distribution 2.4.

Oppanol B 15SFN made by BASF, polystyrene-equivalent weight average molecular weight (Mw): 108,000, molecular weight distribution 3.2.

Tetrax 6T made by JXTG Energy, polystyrene-equivalent weight average molecular weight (Mw): 80,000, molecular weight distribution 2.2.

Tetrax 3T made by JXTG Energy, polystyrene-equivalent weight average molecular weight (Mw): 49,000, molecular weight distribution 2.2.

The following compounds were selected as the photo radical polymerization initiator (C).

2-benzyl-2-dimethylamino-1-(4-morpholinophenyl)butanone-1 ("Irgacure 369E" made by BASF)

2-dimethylamino-2-(4-methyl-benzyl)-1-(4-morpholin-4-yl-phenyl)-butan-1-one ("Irgacure 379EG" made by BASF)

Bis(2,4,6-trimethylbenzoyl)phenylphosphine oxide ("Irgacure 819" made by BASF)

2,4,6-trimethylbenzoyl diphenylphosphine oxide ("Irgacure TPO" made by BASF)

1-[9-ethyl-6-(2-methylbenzoyl)-9H-carbazol-3-yl]ethanone 1-(O-acetyloxime) ("Irgacure OXE02" made by BASF)

2,2-dimethoxy-1,2-diphenylethan-1-one ("Irgacure 651" made by BASF)

Acetophenone made by Tokyo Chemical Industry, Co., Ltd.

The following compound was selected as the antioxidant.

4-((4,6-bis(octylthio)-1,3,5-triazin-2-yl)amino)-2,6-di-t-butylphenol ("IRGANOX 565" made by BASF)

Evaluation

Compatibility of materials of liquid resin composition ("Compatibility of materials", "Absorbance" in the Tables):

Materials were mixed while heating at 80° C. to prepare a homogeneous mixture and then the mixture was cooled to 23° C., and whether the homogeneous state was kept or not was observed. The absorbance (OD660) of a sample at a wavelength of 660 nm, which was put in a cell having a width of 10 mm in the direction of optical path length was measured using Ultraviolet-visible spectrophotometer V-650 made by JASCO Corporation. Those having an absorbance of less than 0.1 were rated as compatible and pass, and those having an absorbance of 0.1 or more and in which non-homogeneity such as phase separation was visually observed were rated as incompatible and failure. The absorbance is preferably less than 0.1 from the viewpoint of compatibility.

Viscosity ("Suitability for spin coating process," "Viscosity" in Tables):

The viscosity of the liquid resin compositions which were kept homogeneous at 23° C. in the above "Compatibility of materials" was measured to evaluate suitability for spin coating on the upper surface of the substrate which is assumed to be used in an actual process. The viscosity was measured in a temperature condition of 23° C. using Rheometer MCR 302 made by Anton-Paar and cone plate CP 50-2. Those having a shear viscosity at 1 s$^{-1}$ of 2,000 mPa·s or more and less than 4,000 mPa·s were rated as excellent, those having a shear viscosity at 1 s$^{-1}$ of 4,000 mPa·s or more and 10,000 mPa·s or less, or those having a shear viscosity at 1 s$^{-1}$ of 100 mPa·s or more and less than 2,000 mPa·s were rated as pass, and those having a shear viscosity at 1 s$^{-1}$ of more than 10,000 mPa·s or more or less than 100 mPa·s were rated as failure. The viscosity is preferably 100 to 10,000 mPa·s from the viewpoint of suitability for the spin coating process.

Mass reduction ratio when heating cured body ("Heat resistance 1," "Temperature at which mass of cured body is reduced by 1% by heating" in Tables):

The liquid resin composition prepared was sandwiched between two PET films and the composition was spread out to make the thickness down to 50 μm. The resin composition was cured with black light having a wavelength of 365 nm in the condition of an integrated light intensity 3,000 mJ/cm$^2$ to prepare a cured body. Using 5 mg of the resulting cured body, the mass reduction ratio of the cured body by heating was measured by using a simultaneous thermogravimetry/differential thermal analyzer "TG-DTA2000SA" made by Bruker AXS while increasing temperature at a temperature increase rate of 10° C./minute from 30° C. to 350° C. under nitrogen atmosphere, and then at a temperature increase rate of 20° C./minutes 350° C. to 800° C. in air stream. The temperature at which the mass of the cured body is reduced by 1% by heating is shown. Those whose mass was reduced by 1% at the point when the temperature reached 250° C. or more were rated as excellent; those whose mass was reduced by 1% at the point when the temperature reached 200° C. or more and less than 250° C. were rated as pass; those whose mass was reduced by 1% at the point when the temperature reached at 150° C. or more and less than 200° C. were rated as acceptable; and those whose mass was reduced by 1% at the point before the temperature reached 150° C. were rated as failure. The temperature at which the mass of the cured body is reduced by 1% by heating is preferably 150° C. or more, and more preferably 250° C. or more from the viewpoint of suitability for high temperature steps for manufacturing a semiconductor.

Range of elastic modulus of cured body ("Heat resistance 2"•"Elastic modulus at −50 to 250° C." in Tables):

The dynamic viscoelasticity of samples was measured using Viscoelastometer RSA-G2 made by TA Instruments Japan. The dynamic viscoelasticity was measured with a distance between chucks of 10 mm, a sample having the width of 8 mm and the thickness of 0.5 mm, at a strain of 0.1%, a tensile frequency of 1 Hz, a temperature increase rate of 3° C./min, and in a temperature range of −50 to 250° C. Samples with a storage modulus E' of 10 kPa or more in the entire range in the conditions were rated as pass and samples with a storage modulus E' of less than 10 kPa in some temperature range were rated as failure. The elastic modulus is preferably 10 kPa or more.

Adhesiveness at High Temperature ("Adhesiveness in High Temperature Condition (250° C., 1 h, in the Atmosphere)," "Width of Color Change in Periphery" and "Peeling Due to Heating" in Tables):

A 4-inch silicon wafer (diameter 10 cm×thickness 0.47 mm) was laminated with a 4-inch glass wafer (diameter 10 cm×thickness 0.7 mm) using the liquid resin composition prepared. When laminating, the thickness of the resin composition was adjusted to 50 μm. After laminating, the composition was cured with black light having a wavelength of 365 nm in a condition of an integrated light intensity of 3,000 mJ/cm$^2$ to prepare a sample for evaluating adhesiveness in high temperature conditions. The adhesive was applied to the entire surface of lamination. The surface of the 4-inch glass wafer was irradiated with black light. The sample prepared was put on a hot plate which had been previously heated at a predetermined temperature with the 4-inch silicon wafer facing downward to observe the width of the region of color change in the periphery in the direction of the center of the wafer, and occurrence of peeling which could be visually observed from the side of the glass. The temperature of the hot plate was 200° C. or 250° C. and the time of continuing heating was 1 hour. Those with a width of the region of color change in the periphery in the direction of the center of 5 mm or less and without peeling in both temperature conditions were rated as pass and those with a width of more than 5 mm and with peeling were rated as failure. The width of the region of color change in the periphery in the direction of the center is preferably 5 mm or less.

Step for Preparing Samples for Evaluating Suitability for Mechanical/UV Laser Release Process:

A 4-inch silicon wafer (diameter 100 mm×thickness 0.47 mm) was laminated with a 4-inch glass wafer (diameter 100 mm×thickness 0.7 mm) using the liquid resin composition prepared and the composition was cured with black light having a wavelength of 365 nm in a condition of an integrated light intensity of 3,000 mJ/cm$^2$ to prepare a sample for release and disassembling. The adhesive was applied to the entire surface of lamination. The surface of the 4-inch glass wafer was irradiated with black light.

(1) Evaluation of Suitability for Mechanical Release Process ("Releasability," "Release Strength" in Tables):

Releasability was evaluated by a method in which a PET sheet was inserted between the substrates of the prepared sample and the sample was attached to dicing tape ("ERK-3580" made by Denka Company Limited) with the side of the silicon wafer facing downward; a suction cup having a diameter of 50 mm was attached to the end of the sample with the dicing tape while the sample was placed on and fixed to a vacuum chuck; the measurement unit of an electronic spring scale was attached to the center of the suction cup and the scale was vertically raised up. Those in which the strength required for release (release strength) was less than 10 N were rated as excellent, those in which the strength required for release was 10 N or more and 50 N or less were rated as pass, and those in which the strength required for release was more than 50 N and those into which a PET sheet could not be inserted were rated as failure. The release strength is preferably 50 N or less, more preferably 10 N or less, and most preferably less than 10 N. A release strength of 50 N or less facilitates release in a mechanical release process. A composition having a release strength of less than 10 N is particularly preferably applied to a mechanical release process.

(2) Evaluation of Suitability for UV Laser Release Process ("UV Laser Releasability" in Table 6:

The prepared sample was irradiated with UV laser from the side of the glass support. UV laser QLA-355 made by Quark Technology Co., Ltd. was used as UV laser at an output of 6 W, a frequency of 100 kHz, and with a scan pitch of 25 μm and a beam diameter of 56 μm. The release strength was evaluated by measuring the release strength in the same manner as in the above (1) Evaluation of suitability for mechanical release process.

(3) Evaluation of Suitability for IR Laser Release Process:

The method disclosed in Japanese Patent No. 4565804, for example, may be used in this method. Japanese Patent No. 4565804 discloses a method of using a light heat converting layer (LTHC layer) which absorbs IR laser light and converts it to energy described in, for example, Japanese Patent No. 4405246 in combination with a liquid resin composition. The LTHC layer is applied to the surface of the support and cured to be formed. Japanese Patent No. 4565804 discloses a method for disassembling a laminate by irradiating the laminate with YAG laser or semiconductor laser from the top, while fixing the laminate on a fixer with the support facing upward, which laminate is prepared by bonding the surface of the support on which an LTHC layer is formed to the surface of a silicon wafer on which a liquid resin composition has been spin-coated and irradiating the same with UV from the side of the support to be cured. The laminate is disassembled when the LTHC layer absorbs light energy from IR laser and converts it into heat, and the heat decomposes and vaporizes the adjacent resin layer, and the layer of gas formed by vaporization causes the adhesive strength between the support and the resin layer to disappear.

TABLE 1

|  |  |  | Example 1 | Example 2 | Example 3 | Example 4 | Example 5 | Example 6 | Example 7 |
|---|---|---|---|---|---|---|---|---|---|
| Component (A-1) | ISTA |  | 65 | 76.8 | 70 | 65 | 60 | 54 | 90 |
|  | DTD-A |  |  |  |  |  |  |  |  |
|  | DOD-A |  |  |  |  |  |  |  |  |
| Component (A-2) | A-DCP |  |  | 20 | 20 | 20 | 20 | 26 | 6.8 |
|  | DCP |  | 30 |  |  |  |  |  |  |
|  | ADDA |  |  |  |  |  |  |  |  |
|  | TMPT |  |  |  |  |  |  |  |  |
| Component (B) | Oppanol N 150EP | Mw: 3,050,000 |  | 3.2 |  |  |  |  | 3.2 |
|  | Tetrax 6T | Mw: 80,000 |  |  | 10 | 15 | 20 | 20 |  |
|  | Oppanol N 100 | Mw: 1,550,000 |  |  |  |  |  |  |  |
|  | Oppanol N 80 | Mw: 1,050,000 |  |  |  |  |  |  |  |
|  | Oppanol N 50SF | Mw: 565,000 | 5 |  |  |  |  |  |  |
|  | Oppanol B 15SFN | Mw: 108,000 |  |  |  |  |  |  |  |
| Component (C) | Irgacure OXE02 |  | 0.8 | 0.4 | 0.4 | 0.4 | 0.4 | 0.4 | 0.4 |
|  | Irgacure 819 |  | 0.2 | 0.1 | 0.1 | 0.1 | 0.1 | 0.1 | 0.1 |
|  | Irgacure TPO |  |  |  |  |  |  |  |  |
|  | Irgacure 369E |  |  |  |  |  |  |  |  |
|  | Irgacure 379EG |  |  |  |  |  |  |  |  |
|  | Irgacure 651 |  |  |  |  |  |  |  |  |
|  | Acetophenone |  |  |  |  |  |  |  |  |
| Antioxidant | IRGANOX 565 |  |  |  |  |  |  |  |  |
| Compatibility of materials |  |  | Pass | Pass | Pass | Pass | Pass | Pass | Pass |
| Absorbance |  |  | <0.1 | <0.1 | <0.1 | <0.1 | <0.1 | <0.1 | <0.1 |
| Suitability for spin coating process |  |  | Pass | Pass | Pass | Pass | Pass | Excellent | Pass |
| Viscosity (mPa · s) |  |  | 1200 | 7300 | 400 | 1300 | 4100 | 2200 | 9000 |
| Heat resistance 1 |  |  | Excellent | Excellent | Excellent | Excellent | Excellent | Excellent | Pass |
| Temperature at which mass of cured body is reduced by 1% (° C.) |  |  | 280 | 275 | 277 | 277 | 286 | 270 | 211 |
| Heat resistance 2 |  |  | Pass | Pass | Pass | Pass | Pass | Pass | Pass |
| Storage modulus at −50 to 250° C. (kPa) |  |  | >10 | >10 | >10 | >10 | >10 | >10 | >10 |
| Adhesiveness in high temperature condition (250° C., 1 h, in the atmosphere) |  |  | Pass | Pass | Pass | Pass | Pass | Pass | Pass |
| Width of color change in periphery (mm) |  |  | <5 | <5 | <5 | <5 | <5 | <5 | <5 |
| Peeling due to heating |  |  | None | None | None | None | None | None | None |
| Releasability |  |  | Excellent | Excellent | Excellent | Pass | Pass | Excellent | Pass |
| Release strength (N) |  |  | 3 | 4 | 5 | 8 | 10 | 4 | 17 |

|  |  | Example 8 | Example 9 | Example 10 | Example 11 | Example 12 | Example 13 |
|---|---|---|---|---|---|---|---|
| Component (A-1) | ISTA | 75 | 60 | 76 | 76 | 72 | 65 |
|  | DTD-A |  |  |  |  |  |  |
|  | DOD-A |  |  |  |  |  |  |
| Component (A-2) | A-DCP | 10 | 30 | 20 | 20 | 20 | 20 |
|  | DCP |  |  |  |  |  |  |
|  | ADDA |  |  |  |  |  |  |
|  | TMPT |  |  |  |  |  |  |

TABLE 1-continued

| Component | | | | | | | | |
|---|---|---|---|---|---|---|---|---|
| Component (B) | Oppanol N 150EP | Mw: 3,050,000 | | | | | | |
| | Tetrax 6T | Mw: 80,000 | 15 | 10 | | | | |
| | Oppanol N 100 | Mw: 1,550,000 | | | 4 | | | |
| | Oppanol N 80 | Mw: 1,050,000 | | | | 4 | | |
| | Oppanol N 50SF | Mw: 565,000 | | | | | 8 | |
| | Oppanol B 15SFN | Mw: 108,000 | | | | | | 15 |
| Component (C) | Irgacure OXE02 | | 0.4 | 0.4 | 0.4 | 0.4 | 0.4 | 0.4 |
| | Irgacure 819 | | 0.1 | 0.1 | 0.1 | 0.1 | 0.1 | 0.1 |
| | Irgacure TPO | | | | | | | |
| | Irgacure 369E | | | | | | | |
| | Irgacure 379EG | | | | | | | |
| | Irgacure 651 | | | | | | | |
| | Acetophenone | | | | | | | |
| Antioxidant | IRGANOX 565 | | | | | | | |
| Compatibility of materials | | | Pass | Pass | Pass | Pass | Pass | Pass |
| Absorbance | | | <0.1 | <0.1 | <0.1 | <0.1 | <0.1 | <0.1 |
| Suitability for spin coating process | | | Excellent | Pass | Pass | Pass | Pass | Excellent |
| Viscosity (mPa · s) | | | 3700 | 500 | 7000 | 4800 | 6900 | 2800 |
| Heat resistance 1 | | | Pass | Excellent | Excellent | Excellent | Excellent | Excellent |
| Temperature at which mass of cured body is reduced by 1% (° C.) | | | 224 | 276 | 267 | 265 | 265 | 265 |
| Heat resistance 2 | | | Pass | Pass | Pass | Pass | Pass | Pass |
| Storage modulus at −50 to 250° C. (kPa) | | | >10 | >10 | >10 | >10 | >10 | >10 |
| Adhesiveness in high temperature condition (250° C., 1 h, in the atmosphere) | | | Pass | Pass | Pass | Pass | Pass | Pass |
| Width of color change in periphery (mm) | | | <5 | <5 | <5 | <5 | <5 | <5 |
| Peeling due to heating | | | None | None | None | None | None | None |
| Releasability | | | Pass | Excellent | Excellent | Excellent | Pass | Pass |
| Release strength (N) | | | 11 | 5 | 4 | 5 | 6 | 12 |

TABLE 2

| | | | Example 14 | Example 15 | Example 16 | Example 17 | Example 18 | Example 19 | Example 20 |
|---|---|---|---|---|---|---|---|---|---|
| Component (A-1) | ISTA | | 64 | 75 | 63 | 74 | 65 | 65 | 65 |
| | DTD-A | | | | | | | | |
| | DOD-A | | | | | | | | |
| Component (A-2) | A-DCP | | 20 | 20 | 20 | 20 | | | |
| | DCP | | | | | | 30 | 30 | 30 |
| | ADDA | | | | | | | | |
| | TMPT | | | | | | | | |
| Component (B) | Oppanol N 150EP | Mw: 3,050,000 | 1 | 1 | | | | | |
| | Ttetrax 6T | Mw: 80,000 | 15 | | 15 | | | | |
| | Oppanol N 100 | Mw: 1,550,000 | | | | | | | |
| | Oppanol N 80 | Mw: 1,050,000 | | | 2 | 2 | | | |
| | Oppanol N 50SF | Mw: 565,000 | | 4 | | 4 | 5 | 5 | 5 |
| | Oppanol B 15SFN | Mw: 108,000 | | | | | | | |
| Component (C) | Irgacure OXE02 | | 0.4 | 0.4 | 0.4 | 0.4 | 0.16 | 0.4 | 1.6 |
| | Irgacure 819 | | 0.1 | 0.1 | 0.1 | 0.1 | 0.04 | 0.1 | 0.4 |
| | Irgacure TPO | | | | | | | | |
| | Irgacure 369E | | | | | | | | |
| | Irgacure 379EG | | | | | | | | |
| | Irgacure 651 | | | | | | | | |
| | Acetophenone | | | | | | | | |
| Antioxidant | IRGANOX 565 | | | | | | | | |
| Compatibility of materials | | | Pass | Pass | Pass | Pass | Pass | Pass | Pass |
| Absorbance | | | <0.1 | <0.1 | <0.1 | <0.1 | <0.1 | <0.1 | <0.1 |
| Suitability for spin coating process | | | Pass | Excellent | Pass | Excellent | Pass | Pass | Pass |
| Viscosity (mPa · s) | | | 5500 | 3500 | 5500 | 3500 | 1200 | 1200 | 1200 |
| Heat resistance 1 | | | Excellent | Excellent | Excellent | Excellent | Pass | Excellent | Excellent |
| Temperature at which mass of cured body is reduced by 1% (° C.) | | | 265 | 265 | 265 | 265 | 204 | 267 | 270 |

TABLE 2-continued

|  |  |  |  |  |  |  |  |
|---|---|---|---|---|---|---|---|
| Heat resistance 2 | Pass | Pass | Pass | Pass | Pass | Pass | Pass |
| Storage modulus at −50 to 250° C. kPa) | >10 | >10 | >10 | >10 | >10 | >10 | >10 |
| Adhesiveness in high temperature condition (250° C., 1 h, in the atmosphere) | Pass | Pass | Pass | Pass | Pass | Pass | Pass |
| Width of color change in periphery (mm) | <5 | <5 | <5 | <5 | <5 | <5 | <5 |
| Peeling due to heating | None | None | None | None | None | None | None |
| Releasability | Pass | Excellent | Excellent | Pass | Pass | Excellent | Excellent |
| Release strength (N) | 11 | 5 | 5 | 6 | 7 | 5 | 5 |

|  |  |  | Example 21 | Example 22 | Example 23 | Example 24 | Example 25 | Example 26 |
|---|---|---|---|---|---|---|---|---|
| Component (A-1) | ISTA |  | 65 | 76.8 | 76.8 | 76.8 | 76.8 | 76.8 |
|  | DTD-A |  |  |  |  |  |  |  |
|  | DOD-A |  |  |  |  |  |  |  |
| Component (A-2) | A-DCP |  |  | 20 | 20 | 20 | 20 | 20 |
|  | DCP |  | 30 |  |  |  |  |  |
|  | ADDA |  |  |  |  |  |  |  |
|  | TMPT |  |  |  |  |  |  |  |
| Component (B) | Oppanol N 150EP | Mw: 3,050,000 |  | 3.2 | 3.2 | 3.2 | 3.2 | 3.2 |
|  | Ttetrax 6T | Mw: 80,000 |  |  |  |  |  |  |
|  | Oppanol N 100 | Mw: 1,550,000 |  |  |  |  |  |  |
|  | Oppanol N 80 | Mw: 1,050,000 |  |  |  |  |  |  |
|  | Oppanol N 50SF | Mw: 565,000 | 5 |  |  |  |  |  |
|  | Oppanol B 15SFN | Mw: 108,000 |  |  |  |  |  |  |
| Component (C) | Irgacure OXE02 |  |  | 0.16 | 0.8 | 1.6 |  |  |
|  | Irgacure 819 |  |  | 0.04 | 0.2 | 0.4 |  |  |
|  | Irgacure TPO |  |  |  |  |  |  |  |
|  | Irgacure 369E |  |  |  |  |  |  |  |
|  | Irgacure 379EG |  |  |  |  |  |  |  |
|  | Irgacure 651 |  | 0.5 |  |  |  | 0.5 |  |
|  | Acetophenone |  |  |  |  |  |  | 0.5 |
| Antioxidant | IRGANOX 565 |  |  |  |  |  |  |  |
| Compatibility of materials |  |  | Pass | Pass | Pass | Pass | Pass | Pass |
| Absorbance |  |  | <0.1 | <0.1 | <0.1 | <0.1 | <0.1 | <0.1 |
| Suitability for spin coating process |  |  | Pass | Pass | Pass | Pass | Pass | Pass |
| Viscosity (mPa · s) |  |  | 1200 | 7300 | 7300 | 7300 | 7300 | 7300 |
| Heat resistance 1 |  |  | Pass | Excellent | Excellent | Excellent | Excellent | so-so |
| Temperature at which mass of cured body is reduced by 1% (° C.) |  |  | 246 | 270 | 255 | 252 | 250 | 157 |
| Heat resistance 2 |  |  | Pass | Pass | Pass | Pass | Pass | Pass |
| Storage modulus at −50 to 250° C. kPa) |  |  | >10 | >10 | >10 | >10 | >10 | >10 |
| Adhesiveness in high temperature condition (250° C., 1 h, in the atmosphere) |  |  | Pass | Pass | Pass | Pass | Pass | Pass |
| Width of color change in periphery (mm) |  |  | <5 | <5 | <5 | <5 | <5 | <5 |
| Peeling due to heating |  |  | None | None | None | None | None | None |
| Releasability |  |  | Pass | Excellent | Excellent | Pass | Excellent | Excellent |
| Release strength (N) |  |  | 6 | 4 | 5 | 6 | 5 | 5 |

TABLE 3

|  |  |  | Example 27 | Example 28 | Example 29 | Example 30 | Example 31 | Example 32 | Example 33 | Example 34 |
|---|---|---|---|---|---|---|---|---|---|---|
| Component (A-1) | ISTA |  |  |  | 32.5 | 32.5 | 65 | 65 | 65 | 65 |
|  | DTD-A |  | 65 | 65 | 32.5 |  |  |  |  |  |
|  | DOD-A |  |  |  |  | 32.5 |  |  |  |  |
| Component (A-2) | A-DCP |  | 20 | 20 | 20 | 20 |  |  | 10 | 20 |
|  | ADDA |  |  |  |  |  | 20 |  | 10 |  |
|  | TMPT |  |  |  |  |  |  | 20 |  |  |
| Component (B) | Oppanol N 150EP | Mw: 3,050,000 |  |  |  |  |  |  |  |  |
|  | Tetrax 6T | Mw: 80,000 | 15 | 15 | 15 | 15 | 15 | 15 | 15 | 15 |

TABLE 3-continued

|  |  |  | Example 27 | Example 28 | Example 29 | Example 30 | Example 31 | Example 32 | Example 33 | Example 34 |
|---|---|---|---|---|---|---|---|---|---|---|
|  | Oppanol N 80 | Mw: 1,050,000 |  |  |  |  |  |  |  |  |
|  | Oppanol N 50SF | Mw: 565,000 |  |  |  |  |  |  |  |  |
|  | Oppanol B 15SFN | Mw: 108,000 |  |  |  |  |  |  |  |  |
| Component (C) | Irgacure OXE02 |  | 0.4 | 0.4 | 0.4 | 0.4 | 0.4 | 0.4 | 0.4 | 0.5 |
|  | Irgacure 819 |  | 0.1 | 0.1 | 0.1 | 0.1 | 0.1 | 0.1 | 0.1 |  |
|  | Irgacure TPO |  |  |  |  |  |  |  |  |  |
|  | Irgacure 369E |  |  |  |  |  |  |  |  |  |
|  | Irgacure 379EG |  |  |  |  |  |  |  |  |  |
|  | Irgacure 651 |  |  |  |  |  |  |  |  |  |
| Antioxidant | IRGANOX 565 |  |  |  |  |  |  |  |  |  |
| Compatibility of materials |  |  | Pass | Pass | Pass | Pass | Pass | Pass | Pass | Pass |
| Absorbance |  |  | <0.1 | <0.1 | <0.1 | <0.1 | <0.1 | <0.1 | <0.1 | <0.1 |
| Suitability for spin coating process |  |  | Pass | Excellent | Excellent | Excellent | Pass | Pass | Pass | Pass |
| Viscosity (mPa · s) |  |  | 1500 | 2100 | 2300 | 2500 | 1100 | 1600 | 1100 | 1300 |
| Heat resistance 1 |  |  | Excellent | Excellent | Excellent | Excellent | Excellent | Excellent | Excellent | Excellent |
| Temperature at which mass of cured body is reduced by 1% (° C.) |  |  | 256 | 262 | 267 | 263 | 274 | 269 | 270 | 261 |
| Heat resistance 2 |  |  | Pass | Pass | Pass | Pass | Pass | Pass | Pass | Pass |
| Storage modulus at −50 to 250° C. (MPa) |  |  | >10 | >10 | >10 | >10 | >10 | >10 | >10 | >10 |
| Adhesiveness in high temperature condition (250° C., 1 h, in the atmosphere) |  |  | Pass | Pass | Pass | Pass | Pass | Pass | Pass | Pass |
| Width of color change in periphery (mm) |  |  | <5 | <5 | <5 | <5 | <5 | <5 | <5 | <5 |
| Peeling due to heating |  |  | None | None | None | None | None | None | None | None |
| Releasability |  |  | Pass | Pass | Pass | Pass | Pass | Pass | Pass | Pass |
| Release strength (N) |  |  | 10 | 14 | 9 | 12 | 6 | 6 | 7 | 9 |

TABLE 4

|  |  |  | Example 35 | Example 36 | Example 37 | Example 38 | Example 39 | Example 40 | Example 41 | Example 42 |
|---|---|---|---|---|---|---|---|---|---|---|
| Component (A-1) | ISTA |  | 65 | 65 | 65 | 65 | 65 | 65 | 65 | 65 |
|  | DTD-A |  |  |  |  |  |  |  |  |  |
|  | DOD-A |  |  |  |  |  |  |  |  |  |
| Component (A-2) | A-DCP |  | 20 | 20 | 20 | 20 | 20 | 20 | 20 | 20 |
|  | ADDA |  |  |  |  |  |  |  |  |  |
|  | TMPT |  |  |  |  |  |  |  |  |  |
| Component (B) | Oppanol N 150EP | Mw: 3,050,000 |  |  |  |  |  |  |  |  |
|  | Tetrax 6T | Mw: 80,000 | 15 | 15 | 15 | 15 | 15 | 15 | 15 | 15 |
|  | Oppanol N 80 | Mw: 1,050,000 |  |  |  |  |  |  |  |  |
|  | Oppanol N 50SF | Mw: 565,000 |  |  |  |  |  |  |  |  |
|  | Oppanol B 15SFN | Mw: 108,000 |  |  |  |  |  |  |  |  |
| Component (C) | Irgacure OXE02 |  |  | 1 |  | 0.4 |  |  |  | 0.4 |
|  | Irgacure 819 |  | 0.5 |  | 1 |  |  |  |  | 0.1 |
|  | Irgacure TPO |  |  |  |  |  | 0.1 |  |  |  |
|  | Irgacure 369E |  |  |  |  |  |  | 0.5 |  |  |
|  | Irgacure 379EG |  |  |  |  |  |  |  | 0.5 |  |
|  | Irgacure 651 |  |  |  |  |  |  |  | 0.5 |  |
| Antioxidant | IRGANOX 565 |  |  |  |  |  |  |  |  | 1 |
| Compatibility of materials |  |  | Pass | Pass | Pass | Pass | Pass | Pass | Pass | Pass |
| Absorbance |  |  | <0.1 | <0.1 | <0.1 | <0.1 | <0.1 | <0.1 | <0.1 | <0.1 |
| Suitability for spin coating process |  |  | Pass | Pass | Pass | Pass | Pass | Pass | Pass | Pass |
| Viscosity (mPa · s) |  |  | 1300 | 1300 | 1300 | 1300 | 1300 | 1300 | 1300 | 1300 |
| Heat resistance 1 |  |  | Excellent | Excellent | Excellent | Excellent | Excellent | Excellent | Pass | Excellent |
| Temperature at which mass of cured body is reduced by 1% (° C.) |  |  | 253 | 254 | 250 | 270 | 251 | 258 | 237 | 275 |
| Heat resistance 2 |  |  | Pass | Pass | Pass | Pass | Pass | Pass | Pass | Pass |
| Storage modulus at −50 to 250° C. (MPa) |  |  | >10 | >10 | >10 | >10 | >10 | >10 | >10 | >10 |
| Adhesiveness in high temperature condition (250° C., 1 h, in the atmosphere) |  |  | Pass | Pass | Pass | Pass | Pass | Pass | Pass | Pass |

TABLE 4-continued

|  | Example 35 | Example 36 | Example 37 | Example 38 | Example 39 | Example 40 | Example 41 | Example 42 |
|---|---|---|---|---|---|---|---|---|
| Width of color change in periphery (mm) | <5 | <5 | <5 | <5 | <5 | <5 | <5 | <5 |
| Peeling due to heating | None | None | None | None | None | None | None | None |
| Releasability | Pass | Pass | Pass | Pass | Pass | Pass | Pass | Pass |
| Release strength (N) | 8 | 9 | 9 | 8 | 9 | 8 | 10 | 8 |

TABLE 5

|  |  |  | Comparative Example 1 | Comparative Example 2 | Comparative Example 3 |
|---|---|---|---|---|---|
| Component (A-1) | ISTA |  |  | 96.8 | 80 |
| Component (A-2) | A-DCP |  | 96.8 |  | 20 |
| Component (B) (parts by mass) | Oppanol N 150EP | Mw: 3,050,000 | 3.2 | 3.2 |  |
| Component (C) | Irgacure OXE02 |  | 0.4 | 0.4 | 0.4 |
|  | Irgacure 819 |  | 0.1 | 0.1 | 0.1 |
| Compatibility of materials |  |  | Failure | Pass | Pass |
| Absorbance |  |  | ≥0.1 | <0.1 | <0.1 |
| Suitability for spin coating process |  |  | — | Excellent | Failure |
| Viscosity (mPa · s) |  |  | — | 3000 | <100 |
| Heat resistance 1 |  |  | — | Failure | — |
| Temperature at which mass of cured body is reduced by 1% (° C.) |  |  | — | 149 | — |
| Heat resistance 2 |  |  | — | Failure | — |
| Storage modulus at −50 to 250° C. (kPa) |  |  | — | <10 | — |
| Adhesiveness in high temperature condition (250° C., 1 h, in the atmosphere) |  |  | — | — | — |
| Width of color change in periphery (mm) |  |  | — | — | — |
| Peeling due to heating |  |  | — | — | — |
| Releasability |  |  | — | — | — |
| Release strength (N) |  |  | — | — | — |

TABLE 6

|  |  |  | Example 1 |
|---|---|---|---|
| Component (A-1) | ISTA |  | 65 |
| Component (A-2) | DCP |  | 30 |
| Component (B) | Oppanol N 50SF | Mw: 565,000 | 5 |
| Component (C) | Irgacure OXE02 |  | 0.8 |
|  | Irgacure 819 |  | 0.2 |
| Compatibility of materials |  |  | Pass |
| Absorbance |  |  | <0.1 |
| Suitability for spin coating process |  |  | Pass |
| Viscosity (mPa · s) |  |  | 1200 |
| Heat resistance 1 |  |  | Excellent |
| Temperature at which mass of cured body is reduced by 1% (° C.) |  |  | 280 |
| Heat resistance 2 |  |  | Pass |
| Storage modulus at −50 to 250° C. (kPa) |  |  | >10 |
| Adhesiveness in high temperature condition (250° C., 1 h, in the atmosphere) |  |  | Pass |
| Width of color change in periphery (mm) |  |  | <5 |
| Peeling due to heating |  |  | None |
| Mechanical releasability |  |  | Excellent |
| Release strength (N) |  |  | 3 |

TABLE 6-continued

|  | Example 1 |
|---|---|
| UV laser releasability | Excellent |
| Release strength (N) | 0.8 |

The results in Tables 1 to 5 show that the resin composition of the present invention has excellent compatibility, suitability for spin coating process and heat resistance. When (A-1) is not used and only (A-2) was used as the monomer, polyisobutene was separated and the resultant mixture was not compatible (Comparative Example 1). When (A-2) is not used, the composition does not have heat resistance required (Temperature at which mass of cured body is reduced by 1% (° C.), elastic modulus) (Comparative Example 2). When (B) is not used, the viscosity is less than the required minimum value (Comparative Example 3). Although the composition has the effect of the present invention when acetophenone, a phenyl ketone photo radical polymerization initiator having low heat resistance, is used as (C), the composition has low heat resistance (Example 26).

The results of Table 6 also show that the composition of Example 1 has excellent mechanical releasability and UV laser releasability. In particular, the release strength before UV irradiation of 3N has been observed to be reduced to 0.8 N after irradiation of UV laser.

The resin composition of the present invention ensures compatibility of materials and the lowest necessary viscosity for spin coating process, and thus has excellent adhesiveness, heat resistance and releasability at room temperature and high temperature.

The resin compositions according to the present Examples have suitability for mechanical release processes. The compositions enabled release at a release strength of 3N under the following conditions. A thin and sharp metal blade for making an opening was inserted into the end of the interface between a silicon wafer and a glass support of the laminate prepared by the method described in the above Example 1. The laminate was horizontally fixed with the glass substrate facing upward, and after inserting the blade, upward stress was applied to the support on the upper side to extend the opening to release the wafer from the support.

Furthermore, as a method for evaluating the energy required for release, a method called Maszara test was used, in which a thin and sharp blade was inserted thereinto as described above only for a certain distance and how far the opening was extended at that stage was measured. The sample bonded by using the liquid resin having the composition of Example 1 exhibited a sufficiently low value of 0.8 J/cm$^2$ even in that test.

XPS elemental analysis of the surface of the silicon wafer of the laminate released by the above mechanical release process was also performed using X-ray photoelectron spectroscopy K-Alpha made by Thermo Fisher Scientific K. K.

The resulting data was the same as the data of the silicon wafer before bonding (more specifically, no change was observed in the intensity of the carbon peak derived from organic substances). The results show that the present invention is also advantageous in that it is not necessary to clean the silicon wafer after release. FIG. 1 and the following Table 7 show the data of XPS analysis of the surface of a bear silicon wafer after bonding and releasing the bear Si wafer and the glass substrate using the sample having the composition of Example 1. The elemental analysis brings the confirmation of the absence of residue of the resin composition of the material for temporary bonding.

The XPS data in FIG. 1 shows the presence of peaks indicating that residue of the composition of the uncleaned product of reference is on the surface. By contrast, peaks are apparently small in the uncleaned product of the sample according to the present Examples, suggesting that cleaning is not necessary. The following Table 7 shows semi-quantitative values of elements detected and their average when measurement was performed at three sites in the reference and the samples of the present Examples, respectively.

[Table 7]

XPS

Apparatus: X-ray photoelectron spectroscopy K-Alpha made by Thermo Fisher Scientific K. K.

Excitation source: Al-X radioactive source with monochromator

Measurement region: 400×200 μm

TABLE 7

| | | Semi-quantitative value of detected elements (unit: atom %) | | | | | | |
|---|---|---|---|---|---|---|---|---|
| Sample | Portion(s) measured | C | N | O | Na | Si | S | Zn |
| (1) Reference, uncleaned product | 1 | 20 | 1 | 28 | 1 | 42 | 10 | N.D |
| | 2 | 21 | 1 | 27 | N.D | 42 | 9 | N.D |
| | 3 | 19 | 1 | 28 | 1 | 42 | 9 | N.D |
| | Average | 20 | 1 | 28 | 1 | 42 | 9 | N.D |
| (2) Sample, uncleaned product | 1 | 16 | 1 | 32 | N.D | 43 | 8 | N.D |
| | 2 | 15 | 1 | 32 | N.D | 43 | 9 | N.D |
| | 3 | 17 | 1 | 32 | N.D | 41 | 8 | N.D |
| | Average | 16 | 1 | 32 | N.D | 42 | 9 | N.D |

The resin compositions according to the present Examples are suitable for UV laser release processes. The silicon wafer/glass support laminate prepared by the method described in the above Example 1 was fixed on a fixer with the silicon wafer facing downward and the laminate was irradiated with UV laser QLA-355 manufactured by Quark Technology Co., Ltd. at an output of 6 W, a frequency of 100 kHz, and with a scan pitch of 25 μm and a beam diameter of 56 μm from the side of the glass support. Then, the release strength was measured in the same manner as in the above (1) Evaluation of suitability for mechanical release process, and as a result the release strength before UV irradiation of 3N was reduced to 0.8 N.

INDUSTRIAL APPLICABILITY

The present invention has excellent heat resistance, low outgas properties and releasability.

The composition of the present invention readily exhibits strong adhesiveness only by being irradiating with ultraviolet light or visible light in the manufacture of various electronic parts, optical parts and optical devices, and thus provides excellent operationability and productivity. Furthermore, the outgas from the cured body of the composition of the present invention is extremely small at a high temperature of 250° C. The composition of the present invention can be easily released after processing. Thus, various electronic parts, optical parts and optical devices obtained by bonding using the composition of the present invention can undergo a deposition process at a high temperature of more than 200° C. or baking coating at high temperature.

Surface mount for circuit substrates has been applied even to optical parts such as image censors in addition to electronic parts such as ICs, resistors and inductors. In these cases the components are sent to soldering reflow at high temperature. Nowadays, in particular zinc-free soldering requires tough temperature conditions for soldering reflow. In such a manufacturing process the step at which the composition of the present invention is used is required to withstand heat treatment at high temperature sufficiently in order to improve quality of optical parts and optical devices or to increase productivity and production yield. Optical parts and optical devices manufactured by using the composition of the present invention can withstand the heat treatment at high temperature sufficiently, and thus are industrially highly useful.

The invention claimed is:

1. A composition for temporary bonding, comprising the following (A) to (C):
   (A) a (meth)acrylate comprising the following (A-1) and (A-2):
      (A-1) a monofunctional (meth)acrylate whose homopolymer has a Tg of −100° C. to 60° C., and
      (A-2) a polyfunctional (meth)acrylate having an alicyclic structure;
   (B) a polyisobutene homopolymer; and
   (C) a photo radical polymerization initiator, and
   wherein an amount of the component (A-1) is 54 to 90 parts by mass, an amount of the component (A-2) is 1 to 40 parts by mass, and an amount of the component (B) is 1 to 20 parts by mass, with respect to 100 parts by mass of the total amount of the components (A) and (B).

2. The composition for temporary bonding according to claim 1, wherein the component (A-1) is a monofunctional (meth)acrylate having an alkyl group.

3. The composition for temporary bonding according to claim 1, wherein the polyfunctional (meth)acrylate (A-2) has a molecular weight of 900 or less.

4. The composition for temporary bonding according to claim 1, wherein the component (A-2) is one or more selected from tricyclodecanedimethanol di(meth)acrylate and 1,3-di(meth)acryloyloxyadamantane.

5. The composition for temporary bonding according to claim 1, wherein the component (B) is a polyisobutene homopolymer having a weight average molecular weight of 1,000 or more and 5,000,000 or less and a molecular weight distribution of 1.1 or more and 5.0 or less.

6. The composition for temporary bonding according to claim 1, wherein the component (C) is one or more photo radical polymerization initiators selected from an acylphosphine oxide compound and an oxime ester compound.

7. The composition for temporary bonding according to claim 1, wherein the component (C) is one or more selected from bis(2,4,6-trimethylbenzoyl)phenylphosphine oxide and 1-[9-ethyl-6-(2-methylbenzoyl)-9H-carbazol-3-yl]ethanone 1-(O-acetyloxime).

8. The composition for temporary bonding according to claim 1, comprising 0.01 to 5 parts by mass of the component (C) with respect to 100 parts by mass of the total amount of the components (A) and (B).

9. The composition for temporary bonding according to claim 1, comprising 54 to 75 parts by mass of the component (A-1), 20 to 26 parts by mass of the component (A-2) and 5 to 20 parts by mass of the component (B) with respect to 100 parts by mass of the total amount of the components (A) and (B).

10. An adhesive for temporary bonding, comprising the composition for temporary bonding according to claim 1.

11. A cured body obtained by curing the composition for temporary bonding according to claim 1.

12. An adhesive sheet comprising the cured body according to claim 11.

13. The cured body according to claim 11, wherein the temperature at which the mass reduction ratio by heating reaches 1% by mass is 250° C. or more.

14. An adhesive for temporary bonding for manufacturing an electronic device, comprising the composition for temporary bonding according to claim 1.

15. A bonded body obtained by adhering a substrate using the adhesive for temporary bonding for manufacturing an electronic device according to claim 14.

16. A method for producing a thin wafer, the method comprising the steps of:
    (a) bonding a circuit-bearing surface of a wafer to a support with the adhesive according to claim 14;
    (b) photo-curing the adhesive;
    (c) grinding a back surface of the wafer to reduce the thickness of the wafer;
    (d) processing the back surface of the thinned wafer; and
    (e) releasing the processed wafer from the support.

17. The adhesive for temporary bonding for manufacturing an electronic device according to claim 14, which is for mechanical release.

18. The adhesive for temporary bonding for manufacturing an electronic device according to claim 14, which is for UV laser release.

* * * * *